United States Patent
Hafizi

(10) Patent No.: US 10,057,090 B2
(45) Date of Patent: Aug. 21, 2018

(54) APPARATUS AND METHOD FOR TRANSMITTING DATA SIGNAL BASED ON VARIOUS TRANSMISSION MODES

(71) Applicant: QUALCOMM Incorporated, San Diego, CA (US)

(72) Inventor: Madjid Hafizi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/276,515

(22) Filed: Sep. 26, 2016

(65) Prior Publication Data

US 2018/0091333 A1    Mar. 29, 2018

(51) Int. Cl.
*H04L 25/03* (2006.01)
*G05F 1/56* (2006.01)
*H03K 19/0175* (2006.01)

(52) U.S. Cl.
CPC .......... *H04L 25/03885* (2013.01); *G05F 1/56* (2013.01); *H03K 19/0175* (2013.01); *H03K 19/017509* (2013.01); *H03K 19/017545* (2013.01); *H04L 25/03343* (2013.01); *G06F 2213/0042* (2013.01)

(58) Field of Classification Search
CPC ........ H04L 25/03343; H04L 25/03885; H04B 1/00
See application file for complete search history.

(56) References Cited

U.S. PATENT DOCUMENTS

| 6,127,878 A | * | 10/2000 | Hanson | ................ | G11C 7/1012 |
| | | | | | 327/112 |
| 6,886,052 B2 | * | 4/2005 | Chiu | ....................... | G06F 3/023 |
| | | | | | 326/37 |
| 7,595,674 B1 | | 9/2009 | Cetin et al. | | |

(Continued)

FOREIGN PATENT DOCUMENTS

WO    WO-2004086651 A1    10/2004

OTHER PUBLICATIONS

Partial International Search Report—PCT/US2017/049922—ISA/EPO—dated Jan. 4, 2018.

(Continued)

*Primary Examiner* — Jean B Corrielus
(74) *Attorney, Agent, or Firm* — Loza & Loza, LLP/Qualcomm

(57) ABSTRACT

A transmit driver or transmitter is provided to generate an output data signal based on different input modes, such as low speed (LS), full speed (FS), high speed (HS), and high speed interconnect (HSIC) modes of a Universal Serial Bus (USB) standard. The transmit driver includes a rail voltage generator for generating a rail voltage for a set of transmit driver slices based on the selected mode. The transmit driver includes a bias voltage generator for generating a bias voltage based on the selected mode for protecting transistors in the transmit driver slices from over-voltage stress. The transmit driver includes a predriver and level shifter for generating input signals for the transmit driver slices to set the output impedance of the transmit driver and the slew rate of the output data signal. The transmit driver includes an emphasis equalizer for providing controllable emphasis equalization to the output data signal.

25 Claims, 8 Drawing Sheets

(56) References Cited

U.S. PATENT DOCUMENTS

| | | | |
|---|---|---|---|
| 8,453,939 B2 | 6/2013 | Lee | |
| 9,152,257 B2 | 10/2015 | McCall et al. | |
| 9,419,746 B1* | 8/2016 | Baeckler | H04L 1/0001 |
| 2007/0064778 A1* | 3/2007 | Lacy | G06F 13/4072 |
| | | | 375/219 |
| 2007/0071111 A1 | 3/2007 | Muljono et al. | |
| 2008/0056344 A1* | 3/2008 | Hidaka | H04L 25/03885 |
| | | | 375/232 |
| 2009/0284288 A1* | 11/2009 | Zhang | H03K 3/017 |
| | | | 327/118 |
| 2010/0164588 A1* | 7/2010 | King | H03K 3/356113 |
| | | | 327/307 |
| 2011/0169674 A1* | 7/2011 | Kuramochi | H03M 1/0604 |
| | | | 341/143 |
| 2014/0035549 A1 | 2/2014 | Hafizi et al. | |
| 2014/0173303 A1* | 6/2014 | Chen | G06F 13/4004 |
| | | | 713/310 |
| 2015/0316977 A1 | 11/2015 | Low | |
| 2016/0087658 A1* | 3/2016 | Weissman | H04B 1/10 |
| | | | 455/78 |
| 2016/0162427 A1 | 6/2016 | Kang et al. | |
| 2016/0162430 A1* | 6/2016 | Ma | G06F 1/3287 |
| | | | 710/313 |
| 2017/0168979 A1* | 6/2017 | Remple | G06F 13/4282 |
| 2017/0169877 A1* | 6/2017 | Zerbe | G11C 11/4076 |

OTHER PUBLICATIONS

International Search Report and Written Opinion—PCT/US2017/049922—ISA/EPO—dated Mar. 23, 2018.

* cited by examiner

APPARATUS AND METHOD FOR TRANSMITTING DATA SIGNAL BASED ON VARIOUS TRANSMISSION MODES

BACKGROUND

Field

Aspects of the present disclosure relate generally to data signal transmitters (also known as "transmit drivers"), and in particular, to an apparatus and method for transmitting data signal based on various transmission modes.

Background

Universal Serial Bus (USB) version 2 ("USB 2") is a widely used digital interface in computer systems these days. USB2 supports several different data rate modes, such as High Speed (HS), Low Speed (LS), Full Speed (FS), and High Speed Interconnect (HSIC). Newer versions of USB will most likely support additional data rate modes.

The data rate modes have different voltage domain requirements. For example, LS and FS modes have the requirement that its transmit data signal is in a voltage domain that specifies high and low logic voltages at 3.0V and 0V, respectively. HS mode has the requirement that its transmit data signal is in a voltage domain that specifies high and low logic voltages at 0.8V and 0V, respectively. HSIC mode has the requirement that its transmit data signal is in a voltage domain that specifies high and low logic voltages at 1.2V and 0V, respectively.

The data rate modes may have other requirements. For example, LS and FS modes have an additional requirement that specifies certain slew rate (e.g., relatively gradual slew rate) for the transmit data signal to reduce signal ringing and electromagnetic interference (EMI). HS and HSIC modes have an additional requirement of a certain output impedance (e.g., 45 Ohms) for a transmit driver configured to generate the transmit data signal to reduce signal reflections off of a transmission line having a characteristic impedance similar to the required output impedance of the transmit driver. Additionally, for HS and HSIC modes, there is a requirement that the transmit data signal needs to have extremely sharp edges to compensate for signal distortion caused by the transmission line through which the transmit data signal propagates.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including at least one transmit driver slice configured to generate an output data signal based on at least one input signal; and a rail voltage generator configured to generate a rail voltage for the at least one transmit driver slice, wherein the rail voltage generator is configured to generate the rail voltage based on a mode signal indicative of a selected voltage domain of the output data signal.

Another aspect of the disclosure relates to a method including generating a rail voltage based on a mode signal indicative of a selected voltage domain of an output data signal; and generating the output data signal based on at least one input signal and the rail voltage.

Another aspect of the disclosure relates to an apparatus including means for generating a rail voltage based on a mode signal indicative of a selected voltage domain of an output data signal; and means for generating the output data signal based on at least one input signal and the rail voltage.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In the past, devices that operate under such different modes employ different transmit drivers to accommodate the modes. For example, such a device would employ a transmit driver to operate in LS and FS modes; another transmit driver to operate in HS mode; and another driver to operate in HSIC mode. However, employing different transmit drivers to accommodate different modes is expensive, increases power consumption, and uses substantial area of one or more integrated circuit (ICs).

In summary, this disclosure provides a unified transmit driver that accommodates all existing USB data modes (e.g., LS, FS, HS, and HSIC) as well as future modes by extension. The unified transmit driver receives a mode signal indicating the mode under which to operate, and produces the proper rail voltage for a set of transmit driver slices, the proper bias voltages for over-voltage protection of transistors used in the transmit driver slices, sets the proper output impedance of the transmit driver slices, sets the proper slew rate for the output (transmit) data signal, and performs the proper equalization to emphasize the output data signal.

Figure 1:
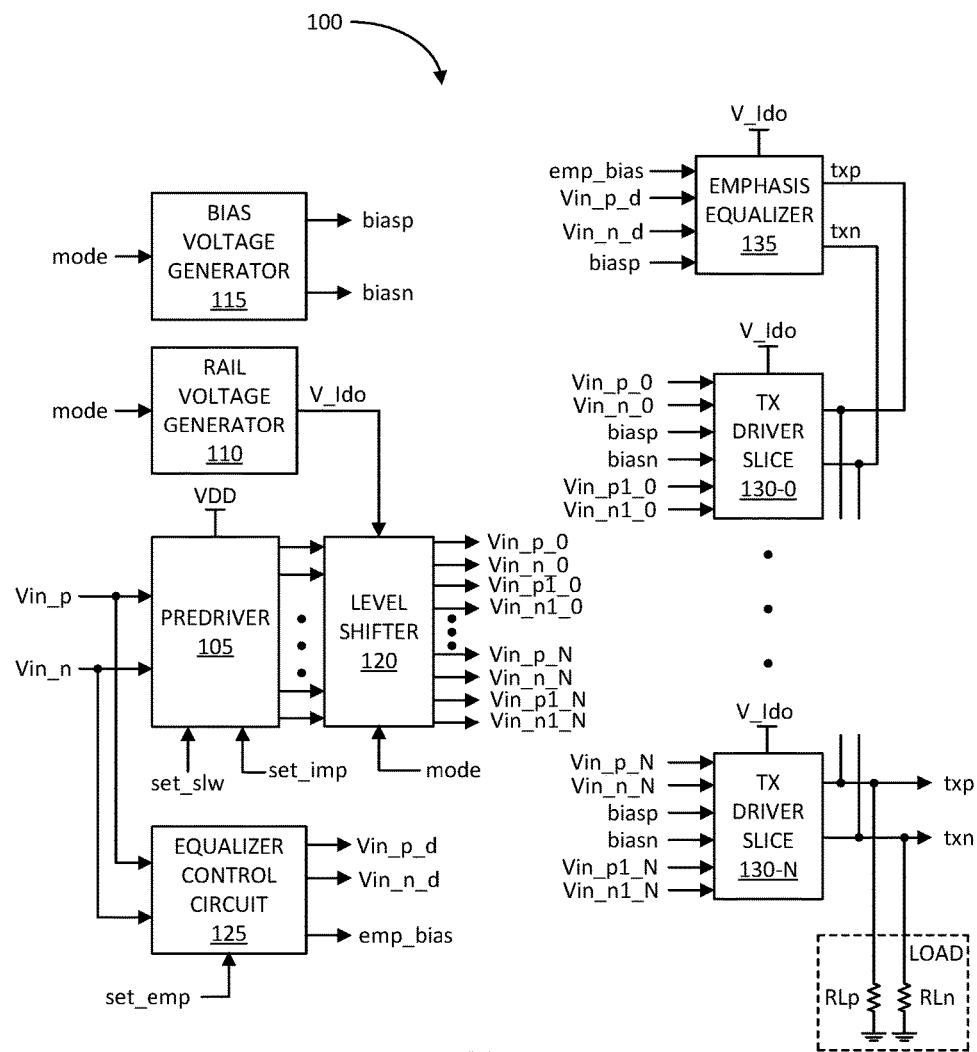
FIG. 1 illustrates a block diagram of an exemplary transmit driver in accordance with an aspect of the disclosure.

FIG. 1 illustrates a block diagram of an exemplary transmit driver 100 in accordance with an aspect of the disclosure. The transmit driver 100 includes a predriver 105, a rail voltage generator 110, a bias voltage generator 115, a level shifter 120, an equalizer control circuit 125, a set of voltage-mode transmit driver slices 130-0 to 130-N, and an emphasis equalizer 135.

The predriver 105 receives an input differential signal Vin_p/Vin_n, and control signals set_imp and set_slw, and generates a set of differential signals based on the input differential signal Vin_p/Vin_n and control signals set_imp and set_slw. The set_imp control signal, which is more relevant for HS and HSIC modes, specifies the output impedance for the transmit driver 100. The set_slw control signal, which is more relevant for LS and FS modes, specifies the slew rate for the output data (differential) signal txp/txn of the transmit driver 100.

The output impedance of the transmit driver 100 is controlled by enabling a certain number of the transmit driver slices and disabling the remaining transmit driver slices. The output impedance is inversely related to the number of transmit driver slices enabled. When M number of transmit driver slices 130-0 to 130-N (M being equal to or less than N) is needed to achieve a desired output impedance for the transmit driver 100, the predriver 105 generates appropriate differential data signals for the M transmit driver slices based on the input differential signal Vin_p/Vin_n, and generates signals to disable the remaining transmit driver slices (N-M). The predriver 105 generates the appropriate differential data signals and the disabling signals based on the set_imp control signal.

The slew rate of output data signal txp/txn of the transmit driver 100 is controlled by applying different delayed versions of the input data signal to the enabled transmit driver slices 130-0 to 130-M. The slew rate is related to the amount of delay between delayed versions of the input data signal. Accordingly, the predriver 105 delays the M data signals by defined amounts to achieve a desired slew rate for the output differential signal txp/txn of the transmit driver 100. The predriver 105 generates the M delayed differential signals based on the set_slw control signal.

The rail voltage generator 110 generates a rail (supply) voltage V_Ido based on the mode signal. The mode signal indicates the selected mode (e.g., LS, FS, HS, HSIC, or other mode) under which the transmit driver 100 operates. For example, if the mode signal indicates LS or FS mode, the rail voltage generator 110 generates a rail voltage V_Ido at substantially 3.0V. This allows the output differential data signal txp/txn to swing substantially between 0V and 3.0V in LS or FS mode. If the mode signal indicates HS mode, the rail voltage generator 110 generates a rail voltage V_Ido at substantially 0.8V. This allows the output differential data signal txp/txn to swing substantially between 0V and 0.8V in HS mode. If the mode signal indicates HSIC mode, the rail voltage generator 110 generates a rail voltage V_Ido at substantially 1.2V. This allows the output differential data signal txp/txn to swing substantially between 0V and 1.2V in HSIC mode.

The bias voltage generator 115 receives the mode signal and generates a first bias voltage biasp based on the mode signal and, in this example, generates a second bias voltage biasn at substantially a fixed voltage. As discussed in more detail further herein, the biasp voltage is applied to the gates of p-channel metal oxide semiconductor (PMOS) field effect transistors (FETs) situated between input PMOS FETs and the differential output of the transmit driver 100, respectively. The biasn voltage is applied to the gates of n-channel metal oxide semiconductor (NMOS) FETs situated between the differential output of the transmit driver 100 and input NMOS FETs, respectively.

For example, if the mode signal indicates FS or LS mode, the bias voltage generator 115 generates biasp at substantially 1.8V so that the PMOS transistors of the transmit driver slices 130-0 to 130-N do not see a voltage across any terminal more than 2.0V for over-voltage (over-stress) protection. If the mode indicates HS or HSIC mode, the bias voltage generator 115 generates biasp at 0V as over-voltage protection may not be needed since the rail voltage V_Ido is less than 2.0V (e.g., the over-voltage threshold). The bias voltage generator 115 may generate biasn at substantially 1.8V for all modes.

The level shifter 120 receives the mode signal and the differential data signals from the predriver 105. The level shifter 120 generates signals Vin_p_0/Vin_n_0 to Vin_p_N/Vin_n_N and Vin_p1_0/Vin_n1_0 to Vin_p1_N/Vin_n1_N for the transmit driver slices 130-0 to 130-N based on the mode signal and the differential data signals from the predriver 105.

Considering the jth transmit driver slice 130-j and it is enabled for output impedance purposes, if the mode signal is LS or FS mode, the level shifter 120 generates Vin_p_j/Vin_n_j at substantially 1.8V to 3.0V to turn on/off the input PMOS transistors of the driver slice 130-j, and Vin_p1_j and Vin_n1_j at substantially 0.9V to 0V to turn on/off the input NMOS transistors of the driver slice 130-j. If the mode signal is HSIC mode, the level shifter 120 generates Vin_p_j/Vin_n_j at substantially 0V to 1.2V to turn on/off the input PMOS transistors of the driver slice 130-j, and Vin_p1_j/Vin_n1_j at substantially 0.9V to 0V to turn on/off the input NMOS transistors of the driver slice 130-j. If the mode signal is HS mode, the level shifter 120 generates Vin_p_j/Vin_n_j and Vin_p1_j/Vin_n1_j at substantially 0 to 0.9V to turn on/off the input PMOS transistors and off/on the input NMOS transistors of the driver slice 130-j.

Considering the jth transmit driver slice 130-j and it is disabled or tristated for output impedance purposes, if the mode signal is LS or FS mode, the level shifter 120 generates Vin_p_j/Vin_n_j at substantially 3.0V to turn off the input PMOS transistors of the driver slice 130-j, and Vin_p1_j and Vin_n1_j at substantially 0V to turn off the input NMOS transistors of the driver slice 130-j. If the mode signal is HSIC mode, the level shifter 120 generates Vin_p_j/Vin_n_j at substantially 1.2V to turn off the input PMOS transistors of the driver slice 130-j, and Vin_p1_j/

Vin_n1_j at substantially 0V to turn off the input NMOS transistors of the driver slice 130-j. If the mode signal is HS mode, the level shifter 120 generates Vin_p_j/Vin_n_j at substantially 0.9V to turn off the input PMOS transistors of the driver slice 130-j, and Vin_p1_j/Vin_n1_j at substantially 0V to turn off the input NMOS transistors of the driver slice 130-j.

The equalizer control circuit 125 receives the input differential signal Vin_p/Vin_n and a set_emp control signal, and generates a delayed input differential signal Vin_p_d/Vin_n_d and an emphasis bias voltage emp_bias based on the input differential signal Vin_p/Vin_n and the set_emp control signal. The delayed input differential signal Vin_p_d/Vin_n_d is the input differential signal Vin_p/Vin_n delayed by 0.5 to 1.0 unit interval (UI), as desired. The emp_bias voltage controls the amount of emphasis provided to the output differential signal txp/txn of the transmit driver 100.

The enabled transmit driver slices 130-0 to 130-M receive differential data signals Vin_p_0/Vin_n_0 to Vin_p_M/Vin_n_M, differential data signals Vin_p1_0/Vin_n1_0 to Vin_p1_M/Vin_n1_M, and bias voltages biasp and biasn, respectively. The enabled transmit driver slices 130-0 to 130-M collectively generate the output differential data signal txp/txn of the transmit driver 100 from these received signals.

The emphasis equalizer 135 receives the delayed input differential signal Vin_p_d/Vin_n_d, the emp_bias voltage, and the biasp bias voltage, and provides emphasis equalization to the output differential data signal txp/txn based on these received signals.

As represented by the dashed box, a load including representative resistors RLp/RLn are coupled to the differential outputs txp/txn of the transmit driver 100, respectively. The output impedance of the transmit driver 100, as set by the predriver 105, should substantially match the impedance of the load resistors RLp/RLn (e.g., 45 Ohms).

Figure 2A:
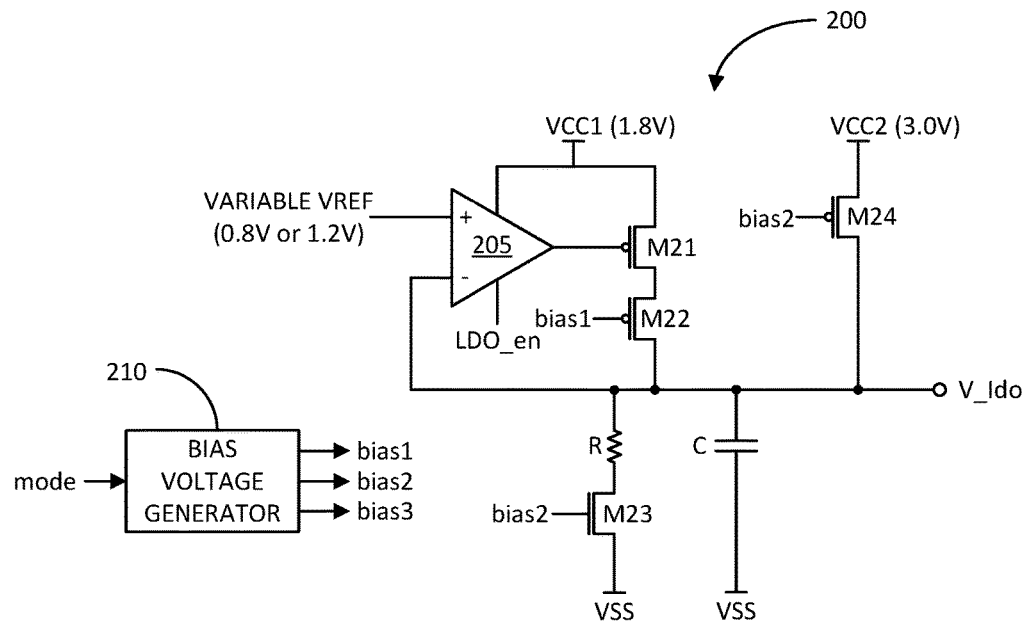
FIG. 2A illustrates a schematic diagram of an exemplary rail voltage generator in accordance with another aspect of the disclosure.

FIG. 2A illustrates a schematic diagram of an exemplary rail voltage generator 200 in accordance with another aspect of the disclosure. The rail voltage generator 200 may be an exemplary detailed implementation of the rail voltage generator 110 previously discussed.

In particular, the rail voltage generator 200 includes a bias voltage generator 210 configured to generate bias voltages bias1, bias2, and bias3 based on the mode signal. If the mode signal indicates LS or FS mode, the bias voltages bias1, bias2, and bias3 are substantially at 1.8V, 0V, and 1.8V, respectively. If the mode signal indicates HS or HSIC mode, the bias voltages bias1, bias2, and bias3 are substantially at 0V, 0.9V, and 3V, respectively.

The rail voltage generator 200 includes a low-dropout (LDO) regulator having operational amplifier 205, PMOS transistor M21, over-voltage protection PMOS transistor M22, resistor R, and NMOS transistor M23. The rail voltage generator 200 includes an LDO bypass circuit including PMOS transistor M24.

The operational amplifier includes a positive input configured to receive a variable reference voltage (e.g., a bandgap voltage at 0.8V or 1.2V). The operational amplifier 205 receives a rail voltage VCC1 (e.g., at substantially 1.8V) and an enable signal LDO_en. The PMOS transistors M21 and M22 are coupled in series between the voltage rail (VCC1) and a negative input of the operational amplifier 205. The PMOS M21 includes a gate coupled to an output of the operational amplifier 205. The PMOS M22 includes a gate configured to receive the bias voltage bias1.

The resistor R and NMOS transistor M23 is coupled in series between the negative input of the operational amplifier 205 (which also serves as the output of the rail voltage generator 200) and a voltage rail VSS. A capacitor C is also coupled between the output of the rail voltage generator 200 and the voltage rail VSS. The NMOS transistor M32 is configured to receive bias voltage bias2. The PMOS M24 is coupled between another rail voltage VCC2 (e.g., at substantially 3.0V) and the output of the rail voltage generator 200. The PMOS M24 includes a gate configured to receive the bias voltage bias2.

The LDO is enabled and the LDO bypass circuit is disabled in HS and HSIC modes. In these modes, the rail voltage V_ldo generated at the output of the rail voltage generator 200 is substantially the same as the variable reference voltage VREF applied to the positive input of the operational amplifier 205 (e.g., VREF=0.8V for HS mode or VREF=1.2V for HSIC mode). In HS and HSIC modes, the bias voltage bias1 is 0V to turn on PMOS M22 so that a feedback loop between the output and the negative input of the operational amplifier 205 is formed. Also, in HS and HSIC modes, the bias voltage bias2 is at 0.9V to turn on NMOS transistor M23 to form a current path between the output and voltage rail VSS. Additionally, in HS and HSIC modes, the bias voltage bias2 is at 3V to turn off PMOS transistor M24 so that the LDO bypass circuit is disabled.

The LDO is disabled and the LDO bypass circuit is enabled in LS and FS modes. In these modes, the bias voltage bias2 is at 1.8V to turn on PMOS M24 and couple the rail voltage VCC2 (3.0V) to the output so that V_ldo is at substantially 3.0V. The bias voltage bias1 is at 1.8V to protect the PMOS transistors M21 and M22 for over-voltage purposes. The bias voltage bias2 is at 0V to turn off NMOS M23 to prevent a current path from the output to the voltage rail VSS.

Figure 2B:
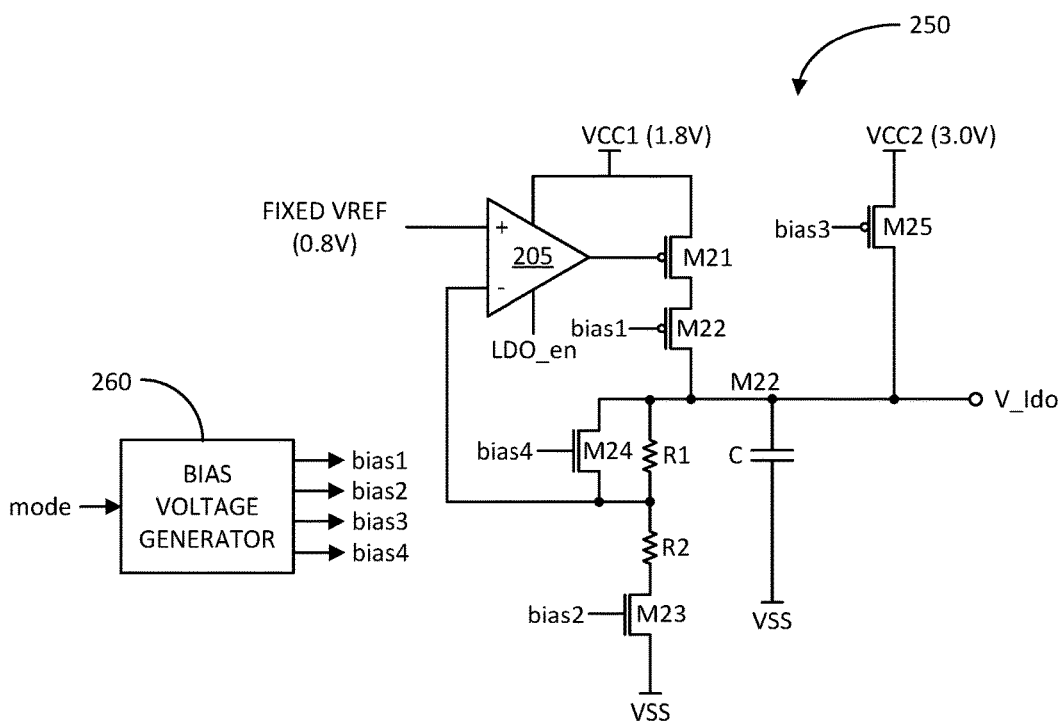
FIG. 2B illustrates a schematic diagram of another exemplary rail voltage generator in accordance with another aspect of the disclosure.

FIG. 2B illustrates a schematic diagram of another exemplary rail voltage generator 250 in accordance with another aspect of the disclosure. The rail voltage generator 250 is a variation of rail voltage generator 200. The rail voltage generator 250 differs from rail voltage generator 200 in that a fixed reference voltage VREF (e.g., 0.8V) is applied to the positive input of the operational amplifier 205. Additionally, the rail voltage generator 250 includes a selectable voltage divider including resistors R1 and R2 with a bypass NMOS transistor M24. Further, the rail voltage generator 250 includes a bias voltage generator configured to generate a bias voltage bias4 in addition to the same bias voltages bias1 to bias3 as that of bias voltage generator 210 previously discussed.

In HS mode, the bias voltage bias4 is substantially at 1.2V to turn on NMOS transistor M24 so that resistor R1 is bypassed. Accordingly, the output voltage V_ldo is at substantially the reference voltage VREF (e.g., 0.8V). In HSIC mode, the bias voltage bias4 is substantially at 0V to turn off NMOS transistor M24. The voltage divider resistors R1 and R2 are configured to generate the output voltage V_ldo at substantially 1.2V when the voltage at the node between R1 and R2 is substantially at the reference voltage VREF (e.g., 0.8V).

Figure 3:
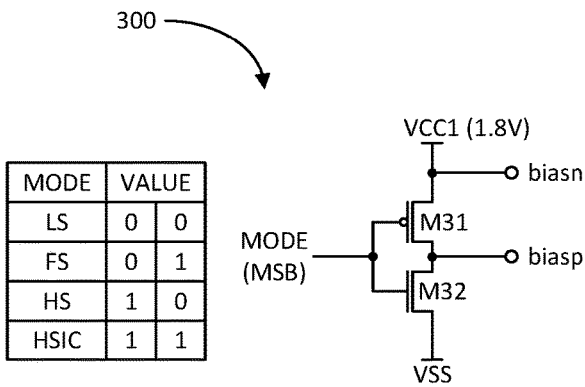
FIG. 3 illustrates a schematic diagram of an exemplary bias voltage generator in accordance with another aspect of the disclosure.

FIG. 3 illustrates a schematic diagram of an exemplary bias voltage generator 300 in accordance with another aspect of the disclosure. The bias voltage generator 300 may be an exemplary implementation of the bias voltage generator 115 previously discussed. The bias voltage generator 300 includes an inverter with PMOS transistor M31 and NMOS transistor M32. The PMOS transistor M31 and NMOS transistor M32 are coupled in series between the rail voltage VCC1 and the rail voltage VSS (e.g., ground). The gates of the PMOS transistor M31 and NMOS transistor M32 are coupled together and configured to receive at least a portion of the mode signal. The bias voltage biasn may be generated at the rail voltage VCC1 (e.g., 1.8V). The bias voltage biasp is generated at the drains of the PMOS transistor M31 and NMOS transistor M32.

The mode signal may be a two-bit signal as indicated in the table illustrated in FIG. 3. For example, the mode signal being a 00 indicates LS mode; the mode signal being a 01 indicates FS mode; the mode signal being a 10 indicates HS mode; and the mode signal being a 11 indicates HSIC mode. The most significant bit (MSB) of the mode signal may be applied to the input of the gates of PMOS transistor M31 and NMOS transistor M32. Accordingly, when the mode signal indicates LS or FS mode with the MSB being a zero (0), the inverter generates biasp at substantially 1.8V. When the mode signal indicates HS or HSIC mode with the MSB being a one (1), the inverter generates biasp at substantially 0V. The bias voltage biasn is fixed at substantially 1.8V.

Figure 4:
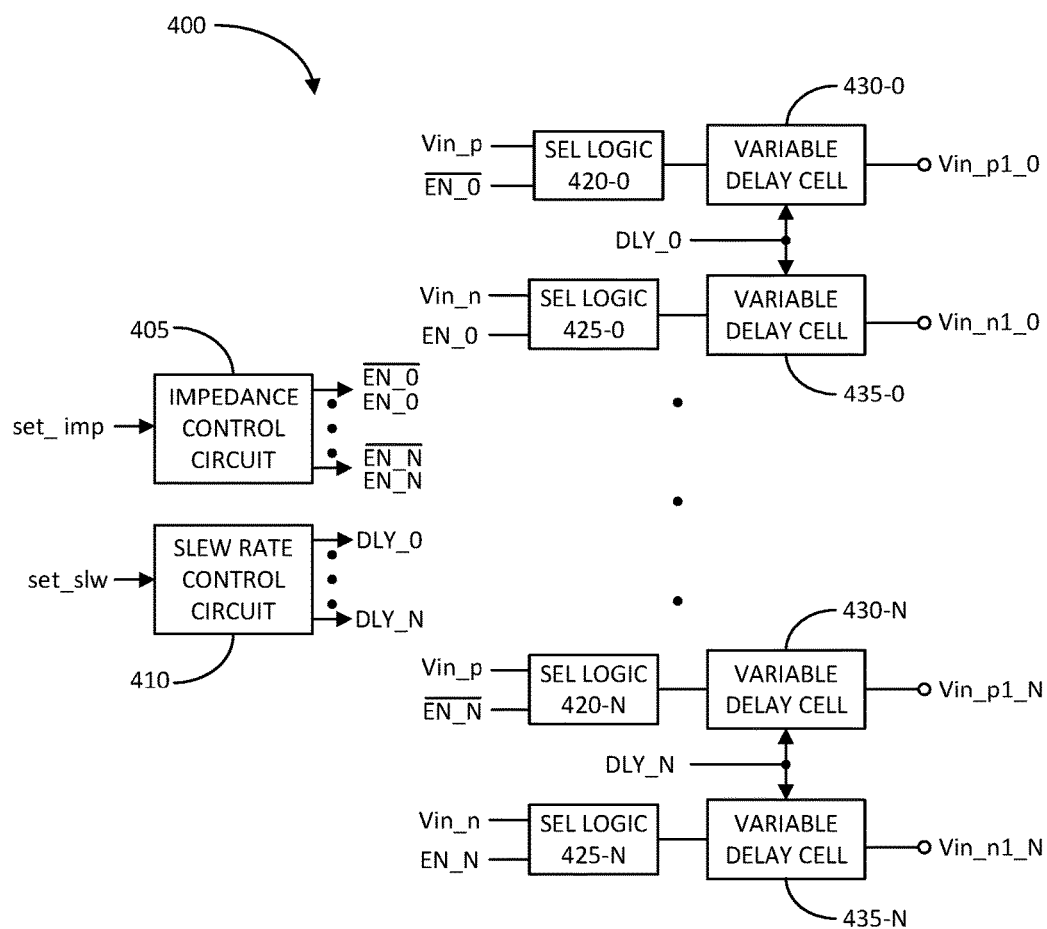
FIG. 4 illustrates a block diagram of an exemplary pre-driver in accordance with another aspect of the disclosure.

FIG. 4 illustrates a block diagram of an exemplary predriver 400 in accordance with another aspect of the disclosure. The predriver 400 may be an exemplary implementation of the predriver 105 previously discussed. The predriver 400 includes an impedance control circuit 405, a slew rate control circuit 410, a first set of selection logic 420-0 to 420-N, a second set of selection logic 425-0 to 425-N, a first set of variable delay cells 430-0 to 430-N, and a second set of variable delay cells 435-0 to 435-N.

The impedance control circuit 405 is configured to generate a set of enable/complementary enable signals EN_0/$\overline{EN\_0}$ to EN_N/$\overline{EN\_N}$ based on the set_imp control signal. The slew rate control circuit 410 is configured to generate a set of delay control signals DLY_0 to DLY_N based on the set_slw control signal.

The first set of selection logic 420-0 to 420-N includes first inputs configured to receive the positive component of the input differential signal Vin_p. The first set of selection logic 420-0 to 420-N include second inputs configured to receive the set of complementary enable signals $\overline{EN\_0}$ to $\overline{EN\_N}$, respectively. The second set of selection logic 425-0 to 425-N include first inputs configured to receive the negative component of the input differential signal Vin_n. The second set of selection logic 425-0 to 425-N include second inputs configured to receive the set of enable signals EN_0 to EN_N, respectively.

The outputs of the first set of selection logic 420-0 to 420-N are coupled to inputs of the first set of variable delay cells 430-0 to 430-N, respectively. The outputs of the second set of selection logic 425-0 to 425-N are coupled to inputs of the second set of variable delay cells 435-0 to 435-N, respectively.

The first and second sets of variable delay cells 430-0/435-0 to 430-N/435-N are configured to receive delay control signals DLY_0 to DLY_N, respectively. The first set of variable delay cells 430-0 to 430-N is configured to generate the positive components of differential signals Vin_p1_0 to Vin_p1_N, respectively. The second set of variable delay cells 435-0 to 435-N is configured to generate the negative components of differential signals Vin_n1_0 to Vin_n1_N, respectively.

The enabling of the jth transmit driver slice 130-j is used to exemplify the operation of the predriver 400. The enabling of the remaining transmit driver slices operates in a similar manner. In operation, if the jth transmit driver slice is enabled for setting the output impedance of the transmit driver 100, the corresponding enable signal EN_j is logic one (1) and the complementary enable signal $\overline{EN\_j}$ is logic zero (0). Accordingly, the corresponding selection logic 420-j and selection logic 425-j pass the input differential signal Vin_p/Vin_n to the corresponding variable delay cells 430-j and 435-j, respectively. The corresponding delay cells 430-j and 435-j delay the input differential signal Vin_p/Vin_n based on the corresponding delay control signal DLY_j to generate a corresponding differential signal Vin_p1_j/Vin_n1_j.

The disabling or tristating of the jth transmit driver slice 130-j is used to exemplify the operation of the predriver 400. The disabling or tristating of the remaining transmit driver slices operates in a similar manner. If the jth transmit driver slice is disabled or tristated for setting the output impedance of the transmit driver 100, the corresponding enable signal EN_j is logic zero (0) and the complementary enable signal $\overline{EN\_j}$ is logic one (1). Accordingly, the corresponding selection logic 420-j and selection logic 425-j do not pass the input differential signal Vin_p/Vin_n to the corresponding variable delay cells 430-j and 435-j, respectively. Instead, the selection logic 420-j generates a logic one (1) and the selection logic 425-j generates a logic zero (0). Accordingly, the corresponding signals Vin_p1_j and Vin_n1_j are at logic high voltage (e.g., 0.9V) and logic low voltage (e.g., 0V) for turning off the input transistors of the corresponding driver slice 130-j.

The collective signals Vin_p1_0/Vin_n1_0 to Vin_p1_N/Vin_n1_N achieve a desired output impedance and slew rate for the output differential data signal txp/txn of the transmit driver 100 based on the set_imp and set_slw control signals.

Figure 5:
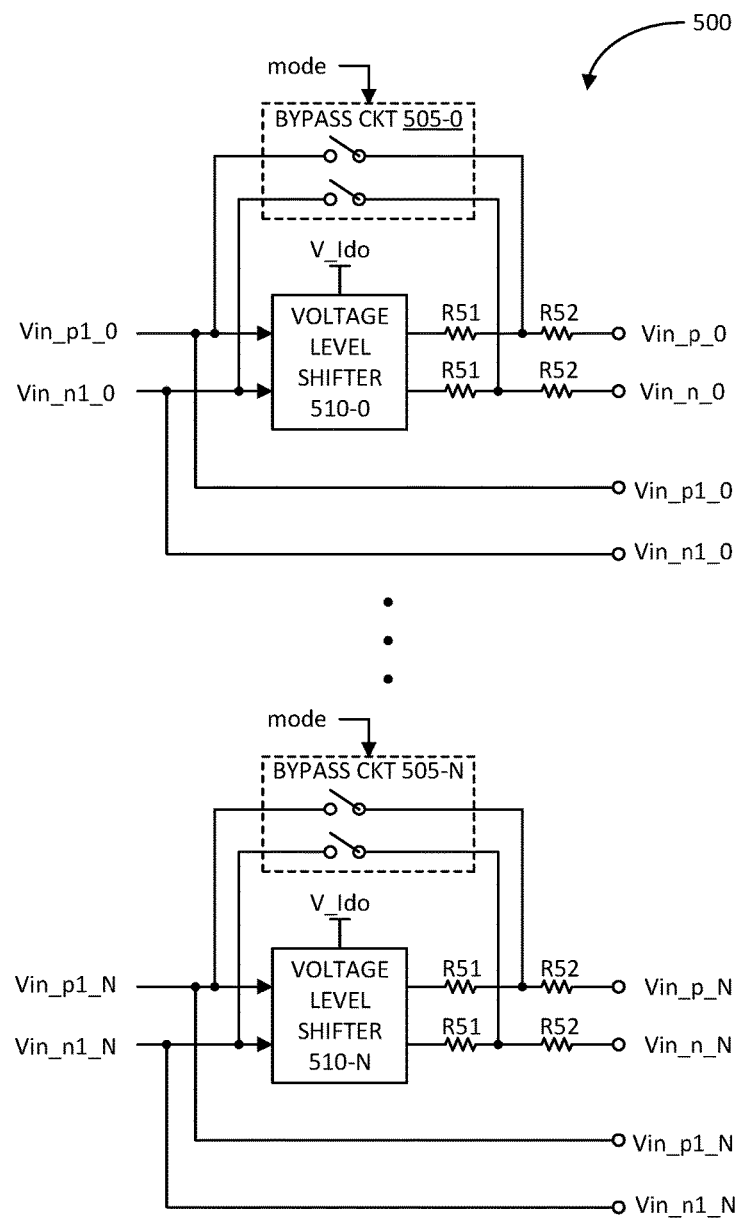
FIG. 5 illustrates a block diagram of an exemplary level shifter in accordance with another aspect of the disclosure.

FIG. 5 illustrates a block diagram of an exemplary level shifter 500 in accordance with another aspect of the disclosure. The level shifter 500 may be a detailed implementation of the level shifter 120 previously discussed. The level shifter 500 includes a set of bypass circuits 505-0 to 505-N and a set of voltage level shifters 510-0 to 510-N.

The bypass circuits 505-0 to 505-N include first inputs configured to receive the positive components of differential signals Vin_p1_0 to Vin_p1_N, respectively. The bypass circuits 505-0 to 505-N include second inputs configured to receive the negative components of differential signals Vin_n1_0 to Vin_n1_N, respectively. The bypass circuits 505-0 to 505-N are also configured to receive the mode signal.

Similarly, the voltage level shifters 510-0 to 510-N include first inputs configured to receive the positive components of differential signals Vin_p1_0 to Vin_p1_N, respectively. The voltage level shifters 510-0 to 510-N include second inputs configured to receive the negative components of differential signals Vin_n1_0 to Vin_n1_N, respectively.

The differential outputs of the voltage level shifters 510-0 to 510-N are coupled to the differential outputs (where differential signals Vin_p_0/Vin_n_0 to Vin_p_N/Vin_n_N are produced) of the level shifter 500 via a pair of series-connected resistors R51 and R52, respectively. The differential outputs of the bypass circuits 505-0 to 505-N are coupled to nodes between the pair of series-connected resistors R51 and R52, respectively.

The level shifter 500 also passes through the input differential signals Vin_p1_0/Vin_n1_0 to Vin_p1_N/Vin_n1_N as outputs.

In operation, if the mode is LS or FS, the voltage level shifters 510-0 to 510-N converts the input differential signal Vin_p1_0/Vin_n1_0 to Vin_p1_N/Vin_n1_N from a first voltage domain (e.g., 0V to 0.9V) to a second voltage domain (e.g., 1.8V to 3V) as differential signals Vin_p_0/

Vin_n_0 to Vin_p_N/Vin_n_N to properly operate the input PMOS transistors of the driver slices 130-0 to 130-N, respectively. Similarly, if the mode is HSIC, the voltage level shifters 510-0 to 510-N converts the input differential signal Vin_p1_0/Vin_n1_0 to Vin_p1_N/Vin_n1_N from a first voltage domain (e.g., 0V to 0.9V) to a third voltage domain (e.g., 0V to 1.2V) as differential signals Vin_p_0/Vin_n_0 to Vin_p_N/Vin_n_N to properly operate the input PMOS transistors of the driver slices 130-0 to 130-N, respectively. If the mode signal indicates LS, FS, or HSIC, the bypass circuits 505-0 to 505-N are disabled (their respective switches are opened to decouple the inputs from the corresponding outputs of the level shifter 500).

If the mode signal indicates HS, the bypass circuits 505-0 to 505-N are enabled to effectively pass through the input differential signals Vin_p1_0/Vin_n1_0 to Vin_p1_N/Vin_n1_N as outputs differential signals Vin_p_N/Vin_n_N, respectively. In HS mode, the voltage level shifters 510-0 to 510-N are bypassed.

Figure 6:
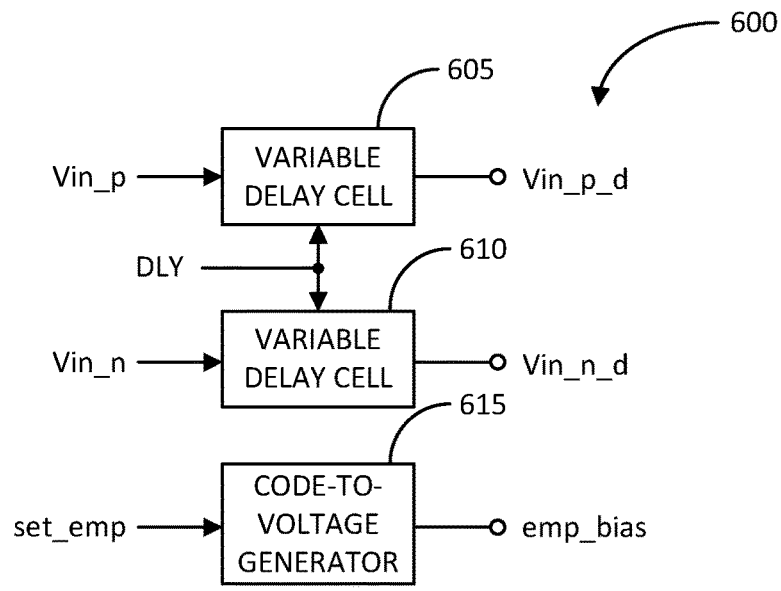
FIG. 6 illustrates a block diagram of an exemplary equalizer control circuit in accordance with another aspect of the disclosure.

FIG. 6 illustrates a block diagram of an exemplary equalizer control circuit 600 in accordance with another aspect of the disclosure. The equalizer control circuit 600 may be a detailed implementation of the equalizer control circuit 125 previously discussed. The equalizer control circuit 600 includes a first variable delay cell 605, a second variable delay cell 610, and a code-to-voltage generator 615.

The first variable delay cell 605 is configured to receive the positive component Vin_p of the input differential signal to the transmit driver 100. The second variable delay cell 610 is configured to receive the negative component Vin_n of the input differential signal to the transmit driver 100. The first and second variable delay cells 605 and 610 are configured to receive a delay control signal DLY to set the delay of the cells from 0.5 to 1.0 UI as desired. The first and second variable delay cells 605 and 610 are configured to generate the delayed input differential signal Vin_p_d/Vin_n_d for the emphasis equalizer 135. Note, the variable delay cells 605 and 610 are different than the variable delayed cells of the predriver 400 previously discussed.

The code-to-voltage generator 615 is configured to receive the set_emp control signal and generate therefrom the bias voltage emp_bias to set the degree of emphasis applied to the output differential data signal txp/txn by the emphasis equalizer 135.

Figure 7:
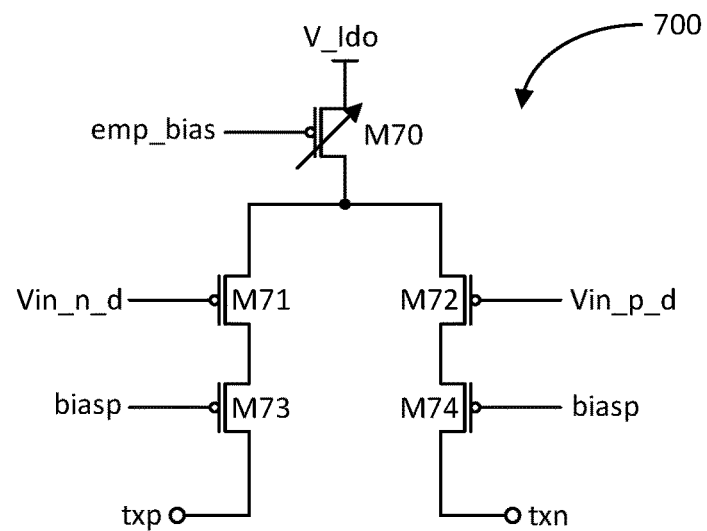
FIG. 7 illustrates a schematic diagram of an exemplary emphasis equalizer in accordance with another aspect of the disclosure.

FIG. 7 illustrates a schematic diagram of an exemplary emphasis equalizer 700 in accordance with another aspect of the disclosure. The emphasis equalizer 700 may be an exemplary detailed implementation of the emphasis equalizer 135 previously discussed. The emphasis equalizer 700 includes a PMOS transistor M70 configured as a current source, PMOS transistors M71 and M72 configured as input differential transistors, and PMOS transistors M73 and M74 configured as over-voltage protection differential transistors.

The current-source PMOS M70 includes a source coupled to a voltage rail V_Ido (receives the rail voltage V_ido generated by the rail voltage generator 110), a drain coupled to the sources of the input PMOS transistors M71 and M72, and a gate configured to receive the bias voltage emp_bias. The gates of input PMOS transistors M71 and M72 are configured to receive the negative and positive components of the delayed input differential signal Vin_n_d/Vin_p_d generated by the equalizer control circuit 125.

The drains of input PMOS transistors M71 and M72 are coupled to the sources of over-voltage protection PMOS transistors M73 and M74, respectively. The gates of the over-voltage protection PMOS transistors M73 and M74 are configured to receive the bias voltage biasp. The sources of the over-voltage protection PMOS transistors M73 and M74 are coupled to the differential outputs txp/txn of the transmit driver 100.

In operation, the bias voltage emp_bias controls the current through the current-source PMOS transistor M70, which sets the amount of emphasis equalization applied to the output differential signal txp/txn of the transmit driver 100.

Figure 8:
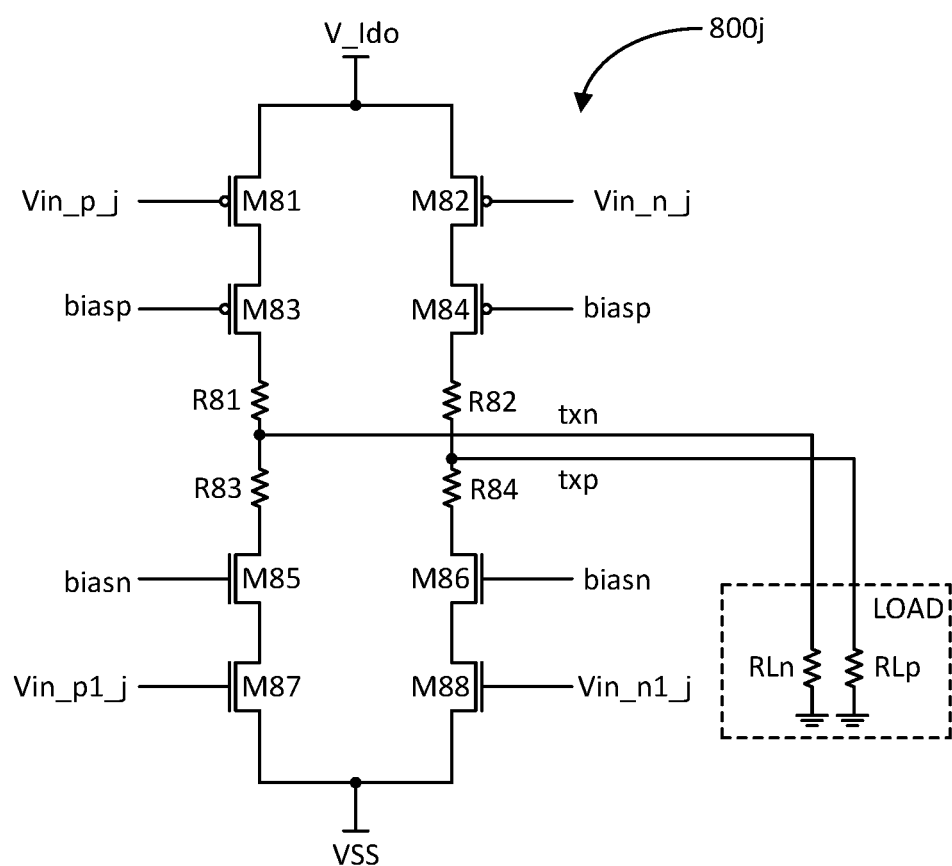
FIG. 8 illustrates a schematic diagram of an exemplary transmit driver slice in accordance with another aspect of the disclosure.

FIG. 8 illustrates a schematic diagram of an exemplary transmit driver slice 800j in accordance with another aspect of the disclosure. The transmit driver slice 800j may be an exemplary implementation of at least one of the transmit driver slices 130-0 to 130-N (e.g., the jth transmit driver slice). The transmit driver slice 800j may be configured as a voltage-mode transmit driver.

In particular, the transmit driver slice 800j includes a first input PMOS transistor M81, a first protection PMOS transistor M83, a first resistor R81, a second resistor R83, a first protection NMOS transistor M85, and a first input NMOS transistor M87 coupled in series between a first voltage rail (V_Ido) and a second voltage rail (VSS). The driver slice 800j also includes a second input PMOS transistor M82, a second protection PMOS transistor M84, a third resistor R82, a fourth resistor R84, a second protection NMOS transistor M86, and a second input NMOS transistor M88 coupled in series between the first voltage rail (V_Ido) and the second voltage rail (VSS).

The first and second input PMOS transistors M81 and M82 include gates configured to receive differential signal Vin_p_j/Vin_n_j generated by the level shifter 120, respectively. The first and second protection PMOS transistors M83 and M84 include gates configured to receive the bias voltage biasp. The first and second protection NMOS transistors M85 and M86 include gates configured to receive bias voltage biasn. The first and second input NMOS transistors M87 and M88 include gates configured to receive differential signal Vin_p1_j/Vin_n1_j generated by the level shifter 120 or predriver 105, respectively.

The positive component txp of the output differential data signal is generated at a node between resistors R82 and R84, and the negative component txn of the output differential data signal is generated at a node between resistors R81 and R82. These nodes are coupled to an output load, as represented by resistors RLp and RLn, respectively.

In operation, in LS or FS mode, the first rail voltage V_Ido is substantially at 3.0V, the biasp is substantially at 1.8V, the biasn is substantially at 1.8V, the differential signal Vin_p_j/Vin_n_j swings between 1.8V and 3.0V, the differential signal Vin_p1_j/Vin_n1_j swings between 0V to 0.9V, and the second voltage rail VSS is at 0V.

When the input differential signal is at a logic one (1), Vin_p_j is substantially at 3.0V, Vin_n_j is substantially at 1.8V, Vin_p1_j is substantially at 0.9V, and Vin_n1_j is substantially at 0V. In this configuration, transistors M81, M83, M86, and M88 are turned off, and transistors M82, M84, M85, and M87 are turned on. As a result, the positive component txp of the output differential data signal is substantially at 3.0V and the negative component txn of the output differential data signal is substantially at 0V.

Because the biasp voltage is substantially at 1.8V, the voltage across any terminal of transistors M81 and M83 is less than 2.0V; and thus, these transistors are protected. Similarly, because the biasn voltage is substantially at 1.8V, the voltage across any terminal of transistors M86 and M88 is less than 2.0V; and thus, these transistors are protected.

When the input differential signal is at a logic zero (0), Vin_p_j is substantially at 1.8V, Vin_n_j is substantially at 3.0V, Vin_p1_j is substantially at 0V, and Vin_n1_j is substantially at 0.9V. In this configuration, transistors M81, M83, M86, and M88 are turned on, and transistors M82, M84, M85, and M87 are turned off. As a result, the positive component txp of the output differential signal is substantially at 0V and the negative component txn of the output differential signal is substantially at 3.0V.

Because the biasp voltage is substantially at 1.8V, the voltage across any terminal of transistors M82 and M94 is less than 2.0V; and thus, these transistors are protected. Similarly, because the biasn voltage is substantially at 1.8V, the voltage across any terminal of transistors M85 and M87 is less than 2.0V; and thus, these transistors are protected.

In HS mode, the first rail voltage V_Ido is substantially at 0.8V, the biasp is substantially at 0V, the biasn is substantially at 1.8V, the differential signals Vin_p_j/Vin_n_j and Vin_p1_j/Vin_n1_j swing between 0V and 0.9V, and the second voltage rail VSS is substantially at 0V.

When the input differential signal is at a logic one (1), Vin_p_j is substantially at 0.9V, Vin_n_j is substantially at 0V, Vin_p1_j is substantially at 0.9V, and Vin_n1_j is substantially at 0V. In this configuration, transistors M81, M83, M86, and M88 are turned off, and transistors M82, M84, M85, and M87 are turned on. As a result, the positive component txp of the output differential signal is substantially at 0.8V and the negative component txn of the output differential signal is substantially at 0V.

When the input differential signal is at a logic zero (0), Vin_p_j is substantially at 0V, Vin_n_j is substantially at 0.9V, Vin_p1_j is substantially at 0V, and Vin_n1_j is substantially at 0.9V. In this configuration, transistors M81, M83, M86, and M88 are turned on, and transistors M82, M84, M85, and M87 are turned off. As a result, the positive component txp of the output differential signal is substantially at 0V and the negative component txn of the output differential signal is substantially at 0.8V.

As the first voltage rail voltage V_Ido is 0.8V (e.g., substantially less than the transistor over-voltage threshold of 2.0V), all the transistors are protected from over-voltage stress.

In HSIC mode, the first rail voltage V_Ido is substantially at 1.2V, the biasp is substantially at 0V, the biasn is substantially at 1.8V, the differential signal Vin_p_j/Vin_n_j swings between 0V and 1.2V, the differential signal and Vin_p1_j/Vin_n1_j swings between 0V and 0.9V, and the second voltage rail VSS is substantially at 0V.

When the input differential signal is at a logic one (1), Vin_p_j is substantially at 1.2V, Vin_n_j is substantially at 0V, Vin_p1_j is substantially at 0.9V, and Vin_n1_j is substantially at 0V. In this configuration, transistors M81, M83, M86, and M88 are turned off, and transistors M82, M84, M85, and M87 are turned on. As a result, the positive component txp of the output differential signal is substantially at 1.2V and the negative component txn of the output differential signal is substantially at 0V.

When the input differential signal is at a logic zero (0), Vin_p_j is substantially at 0V, Vin_n_j is substantially at 1.2V, Vin_p1_j is substantially at 0V, and Vin_n1_j is substantially at 0.9V. In this configuration, transistors M81, M83, M86, and M88 are turned on, and transistors M82, M84, M85, and M87 are turned off. As a result, the positive component txp of the output differential signal is substantially at 0V and the negative component txn of the output differential signal is substantially at 1.2V.

As the first voltage rail voltage V_Ido is 1.2V (e.g., substantially less than the transistor over-voltage threshold of 2.0V), all the transistors are protected from over-voltage stress.

Figure 9:
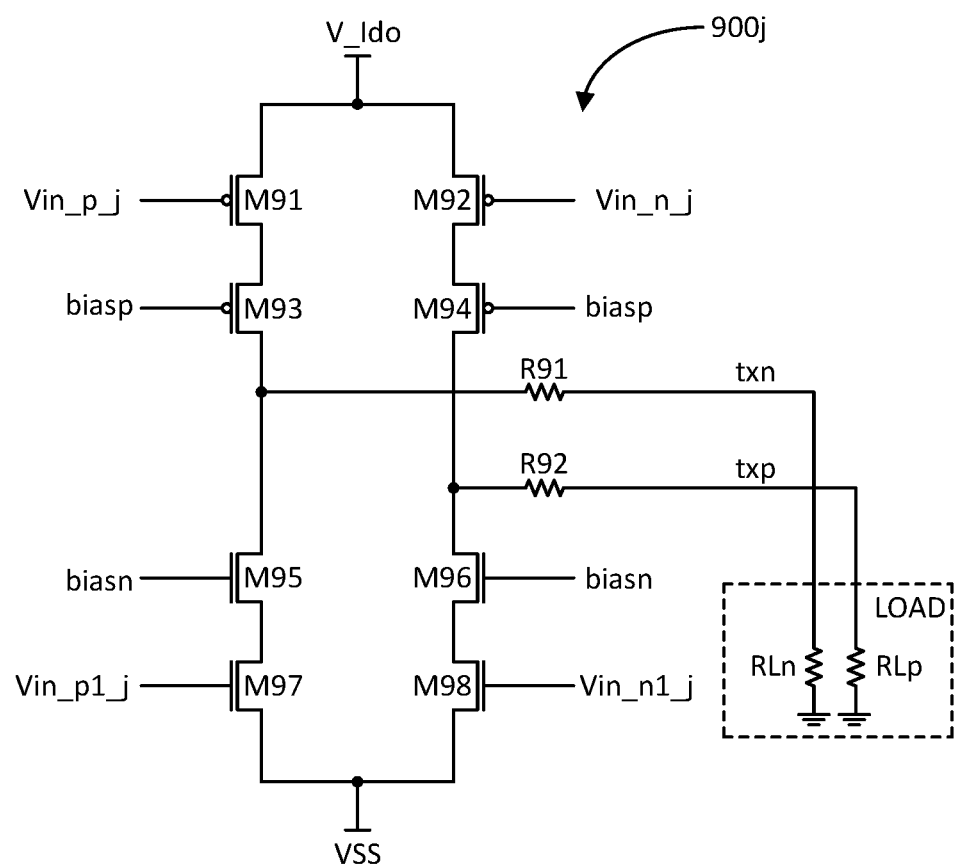
FIG. 9 illustrates a schematic diagram of another exemplary transmit driver slice in accordance with another aspect of the disclosure.

FIG. 9 illustrates a schematic diagram of another exemplary transmit driver slice 900j in accordance with another aspect of the disclosure. The transmit driver slice 900j may be another exemplary implementation of at least one of the transmit driver slices 130-0 to 130-N (e.g., the jth transmit driver slice). The driver slice 900j includes a first input PMOS transistor M91, a first protection PMOS transistor M93, a first protection NMOS transistor M95, and a first input NMOS transistor M97 coupled in series between a first voltage rail (V_Ido) and a second voltage rail (VSS). The transmit driver slice 900j also includes a second input PMOS transistor M92, a second protection PMOS transistor M94, a second protection NMOS transistor M96, and a second input NMOS transistor M98 coupled in series between the first voltage rail (V_Ido) and the second voltage rail (VSS).

The first and second input PMOS transistors M91 and M92 include gates configured to receive differential signal Vin_p_j/Vin_n_j generated by the level shifter 120, respectively. The first and second protection PMOS transistors M93 and M94 include gates configured to receive the bias voltage biasp. The first and second protection NMOS transistors M95 and M96 include gates configured to receive bias voltage biasn. The first and second input NMOS transistors M97 and M98 include gates configured to receive differential signal Vin_p1_j/Vin_n1_j generated by the level shifter 120 or predriver 105, respectively.

The transmit driver slice 900j further includes a pair of resistors R91 and R92 coupled between the drains of M93/M95 and M94/M96 and the representative negative and positive load resistors RLn and RLp of the load, respectively. The positive component txp of the output differential signal is generated at a node between resistors R92 and RLp, and the negative component txn of the output differential signal is generated at a node between resistors R91 and RLn.

The operation of transmit driver slice 900j is similar to that of transmit driver slice 800j previously discussed in detail.

Figure 10:
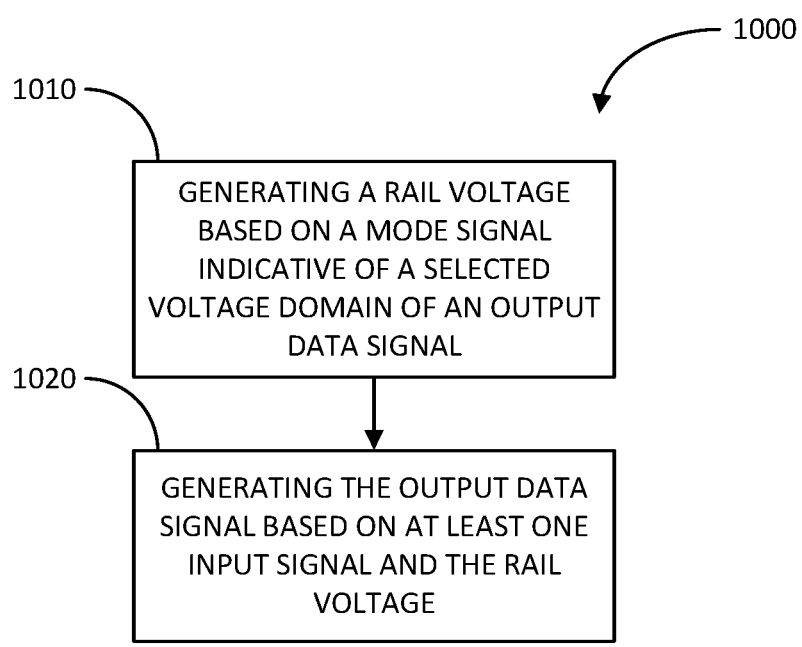
FIG. 10 illustrates a flow diagram of an exemplary method of generating an output data signal in accordance with another aspect of the disclosure.

FIG. 10 illustrates a flow diagram of an exemplary method 1000 of generating an output data signal in accordance with another aspect of the disclosure. The method 1000 includes generating a rail voltage based on a mode signal indicative of a selected voltage domain of an output data signal (block 1010). Examples of means for generating a rail voltage based on a mode signal indicative of a voltage domain of an output data signal include the rail voltage generators 110, 200, and 250.

The method 1000 further includes generating the output data signal based on at least one input signal and the rail voltage (block 1020). Examples of means for generating the output data signal based on at least one input signal and the rail voltage include transmit driver slices 130-0 to 130-N, 800j, and 900j.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. An apparatus, comprising:
at least one transmit driver slice configured to generate an output data signal based on at least one input signal; and
a rail voltage generator configured to generate a rail voltage for the at least one transmit driver slice, wherein the rail voltage generator is configured to generate the rail voltage based on a mode signal indicative of a selected voltage domain of the output data signal, wherein the mode signal further indicates a low speed (LS) mode, full speed (FS) mode, high speed (HS) mode, or high speed interconnect (HSIC) mode of a Universal Serial Bus (USB) standard, wherein the at least one transmit driver slice comprises:
a first input transistor configured to receive a first component of the at least one input signal;
a first protection transistor configured to receive a first bias voltage;
a second protection transistor configured to receive a second bias voltage; and
a second input transistor configured to receive a second component of the at least one input signal, wherein the first input transistor, the first protection transistor, the second protection transistor, and the second input transistor are coupled in series between a first voltage rail and a second voltage rail, and wherein the first voltage rail is configured to receive the rail voltage.

2. The apparatus of claim 1, wherein the rail voltage generator is configured to:
generate the rail voltage at substantially 3.0V if the mode signal indicates the LS mode or the FS mode;
generate the rail voltage at substantially 0.8V if the mode signal indicates the HS mode; and
generate the rail voltage at substantially 1.2V if the mode signal indicates the HSIC mode.

3. The apparatus of claim 1, further comprising a bias voltage generator configured to generate the first bias voltage based on the mode signal.

4. The apparatus of claim 3, wherein the bias voltage generator is configured to:
generate the first bias voltage at substantially 1.8V if the mode signal indicates the LS mode or the FS mode; and
generate the first bias voltage at substantially 0V if the mode signal indicates the HS mode or the HSIC mode.

5. The apparatus of claim 3, wherein the bias voltage generator is configured to generate the second bias voltage independent of the mode signal.

6. The apparatus of claim 1, further comprising an emphasis equalizer configured to apply emphasis equalization to the output data signal.

7. An apparatus, comprising:
at least one transmit driver slice configured to generate an output data signal based on at least one input signal, wherein the at least one transmit driver slice comprises a set of transmit driver slices, wherein the at least one input signal comprises a set of input signals, and wherein the set of transmit driver slices are configured to collectively generate the output data signal based on the set of input signals;
a rail voltage generator configured to generate a rail voltage for the at least one transmit driver slice, wherein the rail voltage generator is configured to select and generate the rail voltage from among a set of different rail voltages based on a mode signal indicative of a selected voltage domain among a set of different voltage domains of the output data signal, respectively; and
a predriver configured to generate the set of input signals based on a control signal for setting an output impedance of the set of transmit driver slices.

8. The apparatus of claim 7, wherein the predriver is configured to:
generate a first subset of one or more of the input signals based on an input data signal and the output impedance control signal, wherein a first subset of one or more transmit driver slices are configured to collectively generate the output data signal based on the first subset of one or more of the input signals; and
generate a second subset of one or more of the input signals based on the output impedance control signal, wherein a second subset of one or more transmit driver slices are configured to be tristated in response to receiving the second subset of one or more input signals.

9. The apparatus of claim 7, wherein the predriver is configured to apply a set of one or more respective delays to the first subset of one or more of the input signals to generate a set of one or more delayed input signals based on a slew rate control signal for controlling a slew rate of the output data signal, wherein the first subset of one or more transmit driver slices are configured to collectively generate the output data signal based on the set of one or more delayed input signals.

10. An apparatus, comprising:
at least one transmit driver slice configured to generate an output data signal based on at least one input signal;
a rail voltage generator configured to generate a rail voltage for the at least one transmit driver slice, wherein the rail voltage generator is configured to generate the rail voltage based on a mode signal indicative of a selected voltage domain of the output data signal; and
a level shifter configured to generate at least one level-shifted input signal based on the at least one input signal and the mode signal, wherein the at least one transmit driver slice is configured to generate the output data signal based on the at least one level-shifted input signal and the at least one input signal.

11. The apparatus of claim 10, wherein the level shifter is configured to:
generate the at least one level-shifted input signal to swing substantially between 1.8V and 3.0V if the mode signal indicates a low speed (LS) mode or full speed (FS) mode of a Universal Serial Bus (USB) standard; or
generate the at least one level-shifted input signal to swing substantially between 0V and 1.2V if the mode signal indicates a high speed Interconnect (HSIC) mode of the USB standard.

12. The apparatus of claim 10, wherein the at least one transmit driver slice comprises:
a p-channel metal oxide semiconductor (PMOS) transistor including a gate configured to receive a corresponding one of the at least one level-shifted input signal; and
an n-channel metal oxide semiconductor (NMOS) transistor including a gate configured to receive a corresponding one of the at least one input signal, wherein the PMOS transistor is coupled in series with the NMOS transistor between a first voltage rail and a second voltage rail.

13. The apparatus of claim 10, wherein the level shifter is configured to bypass the generating of the at least one level-shifted input signal if the mode signal indicates a high speed (HS) mode of the USB standard.

14. The apparatus of claim 13, wherein the at least one transmit driver slice each comprises:
   a p-channel metal oxide semiconductor (PMOS) transistor including a gate configured to receive a corresponding one of the at least one input signal; and
   an n-channel metal oxide semiconductor (NMOS) transistor including a gate configured to receive the corresponding one of the at least one input signal, wherein the PMOS transistor is coupled in series with the NMOS transistor between a first voltage rail and a second voltage rail.

15. An apparatus, comprising:
   at least one transmit driver slice configured to generate an output data signal based on at least one input signal;
   a rail voltage generator configured to generate a rail voltage for the at least one transmit driver slice, wherein the rail voltage generator is configured to generate the rail voltage based on a mode signal indicative of a selected voltage domain of the output data signal;
   an emphasis equalizer configured to apply emphasis equalization to the output data signal; and
   an equalizer control circuit configured to generate at least one delayed input signal based on the at least one input signal, wherein the emphasis equalizer is configured to apply emphasis equalization to the output data signal based on the at least one delayed input signal.

16. An apparatus, comprising:
   at least one transmit driver slice configured to generate an output data signal based on at least one input signal;
   a rail voltage generator configured to generate a rail voltage for the at least one transmit driver slice, wherein the rail voltage generator is configured to generate the rail voltage based on a mode signal indicative of a selected voltage domain of the output data signal;
     an emphasis equalizer configured to apply emphasis equalization to the output data signal, wherein the emphasis equalizer comprises:
     a current source configured to generate a current based on a control signal for controlling a degree of emphasis equalization applied to the output data signal;
     an input transistor configured to receive a delayed version of the at least one input signal;
     a protection transistor configured to receive a bias voltage based on the mode signal, wherein the current source, the input transistor, and the protection transistor are coupled in series between a voltage rail and an output of the at least one transmit driver slice.

17. A method, comprising:
   generating a rail voltage based on a mode signal indicative of a selected voltage domain of an output data signal;
   generating the output data signal based on at least one input signal and the rail voltage; and
   generating a bias voltage to protect one or more transistors used to generate the output data signal, wherein the bias voltage is generated based on the mode signal.

18. The method of claim 17, further comprising applying emphasis equalization to the output data signal.

19. A method, comprising:
   generating a rail voltage based on a mode signal indicative of a selected voltage domain of an output data signal;
   generating the output data signal based on at least one input signal and the rail voltage, wherein the at least one input signal comprises a set of input signals; and
   generating the set of input signals based on a control signal for controlling an output impedance of an output at which the output data signal is generated.

20. A method, comprising:
   generating a rail voltage based on a mode signal indicative of a selected voltage domain of an output data signal;
   generating the output data signal based on at least one input signal and the rail voltage, wherein the at least one input signal comprises a set of input signals; and
   generating the set of input signals based on a control signal for controlling a slew rate of the output data signal.

21. An apparatus, comprising:
   means for generating a rail voltage based on a mode signal indicative of a selected voltage domain of an output data signal; and
   means for generating the output data signal based on at least one input signal and the rail voltage.

22. The apparatus of claim 21, further comprising means for generating a bias voltage to protect one or more transistors used to generate the output data signal, wherein the bias voltage is generated based on the mode signal.

23. The apparatus of claim 21, wherein the at least one input signal comprises a set of input signals, and further comprising means for generating the set of input signals based on a control signal for controlling an output impedance of an output at which the output data signal is generated.

24. The apparatus of claim 21, wherein the at least one input signal comprises a set of input signals, and further comprising means for generating the set of input signals based on a control signal for controlling a slew rate of the output data signal.

25. The apparatus of claim 21, further comprising means for applying emphasis equalization to the output data signal.

* * * * *